United States Patent [19]

Glennon

[11] 4,356,408
[45] Oct. 26, 1982

[54] DRIVE CIRCUIT FOR PARALLEL NON-MATCHED SEMICONDUCTORS

[75] Inventor: Timothy F. Glennon, Rockford, Ill.

[73] Assignee: Sundstrand Corporation, Rockford, Ill.

[21] Appl. No.: 174,488

[22] Filed: Aug. 1, 1980

[51] Int. Cl.³ .................... H03K 17/00; H03K 3/33; H03K 3/01
[52] U.S. Cl. .................... 307/254; 307/270; 307/300; 307/260
[58] Field of Search .............. 307/253, 254, 239, 260, 307/300, 315, 289; 363/59, 132

[56] References Cited

U.S. PATENT DOCUMENTS

| | | | |
|---|---|---|---|
| 3,056,094 | 9/1962 | Crawford | 307/260 |
| 3,931,581 | 1/1976 | Kush, Jr. et al. | 307/253 |
| 4,099,225 | 7/1978 | Hygaard | 363/132 |
| 4,234,805 | 11/1980 | Carlsen | 307/315 |

*Primary Examiner*—David K. Moore
*Assistant Examiner*—B. P. Davis
*Attorney, Agent, or Firm*—Harold A. Williamson; Ted E. Killingsworth; Michael B. McMurry

[57] ABSTRACT

This invention relates to a drive circuit coupled to electrical devices, which may be semiconductors, connected in parallel in a circuit network. The electrical devices have distinct total on-time periods when they are simultaneously energized. The circuit network has a source of power coupled through the parallel connected devices to a load. The drive circuit includes a signal source coupled respectively through a time adjustable circuit to a first electrical device and to a second electrical device. The time adjustable circuit is adjusted such that the total on-time of the first electrical device matches the total on-time of the second electrical device to thereby ensure equal power at all times through the electrical devices to the load. The invention allows a number of parallel devices to act as a single switch.

16 Claims, 14 Drawing Figures

FIG. 10b SERIES RESONANT TURN-OFF CIRCUIT

FIG. 10a SERIES RESONANT TURN-ON CIRCUIT

DRIVE CIRCUIT FOR PARALLEL NON-MATCHED SEMICONDUCTORS

TECHNICAL FIELD

This invention relates to a drive circuit for electrical devices that ensures equal power at all times through the electrical devices when the devices are connected in parallel in a circuit network to a load.

BACKGROUND ART

It has been long recognized that when high power levels are sought to be transmitted through a transistorized circuit and the power rating of individual transistors available, for use in such a circuit is insufficient, then high power operation can be obtained by the parallel connection and operation of lower power rated transistors. The employment of transistors in parallel in such circuits is not without problems. The problems are varied and a number of these problems have been recognized and apparently successfully treated. Inverter circuits provide a typical setting where transistors are operated in parallel and from time-to-time due to excessive current through the transistor, the transistors burnout.

Historically, these inverter circuits have been provided with excess current protective circuits. Transistors in these circuits must be carefully matched, otherwise one of the transistors will take over the whole load of the output current and be destroyed. The Crawford U.S. Pat. No. 3,056,094 recognizes this matching problem and provides a solution that provides balanced current through a number of transistors connected in parallel to a load. The balance is achieved by connecting a resistor in series with the base electrode of each transistor. The value of each of these resistors independently controls the base current for its associated transistor independently. This independent control enables the base bias currents of each of the transistors to be adjusted so that each transistor contributes substantially equally to the output load current even though the transistors used are not matched. The Crawford patent therefore recognizes the steady state power handling capability of a number of unmatched transistors operated in parallel, but does not recognize that the turn-on and turn-off times of the transistors may differ and that the transistor may burnout should a single transistor turn completely on before another. Similarly a transistor may burnout if a transistor turns completely off before another. The invention to be described hereinafter recognizes the turn-on and turn-off problem and remedies the burnout problem during such periods in a unique manner to be described more fully hereinafter.

The Nygaard U.S. Pat. No. 4,099,225 also recognizes the need for a current protective circuit for an inverter with semiconductor control elements. The Nygaard invention is based on the discovery that burn out of semiconductor control elements in circuits that employ an excess current protective circuit is tied to the fact that discharge currents in filter condensors in the control circuit are the culprit involved in transistor burnout. The Nygaard Patent, not unlike the Crawford patent noted above, concerns itself with current detection and control while the invention to which this specification is directed recognizes that the excess current problem may be resolved if the transistors operated in parallel can be exactly matched in respect of their total on-time where the total on-time includes a matching of turn-on and turn-off times for the transistors.

DISCLOSURE OF INVENTION

More specifically, this invention relates to a drive circuit coupled to electrical devices, which may be semiconductors, connected in parallel in a circuit network. The electrical devices have distinct total on-time periods when they are simultaneously energized. The circuit network has a source of power coupled through the parallel connected devices to a load. The drive circuit includes a signal source coupled respectively through a time adjustable circuit to a first electrical device and to a second electrical device. The time adjustable circuit is adjusted such that the total on-time of the first electrical device matches the total on-time of the second electrical device to thereby ensure equal power at all times through the electrical devices to the load. The invention allows a number of parallel devices to act as a single switch.

It is therefore a primary object of the invention to provide a drive circuit for conduction controlled electrical devices connected in parallel such that the total on-time of the electrical devices are matched.

Another object of this invention is to provide a drive circuit for electrical devices connected in parallel to thereby cause the parallel electrical devices to act as a single switch.

Yet another object of this invention is to provide a drive circuit for conduction control of semiconductor devices connected in parallel to thereby ensure equal simultaneous power handling by all semiconductors so connected.

Still yet another object of this invention is to provide a drive circuit for conduction control of semiconductor devices connected in parallel to thereby ensure that semiconductor turn-on times are matched and/or alternatively semiconductor turn-off times are matched, thereby ensuring equal current at all times in the parallel connected semiconductors.

A final object is to provide a drive circuit for a given semiconductor that may be employed with semiconductors connected in parallel such that the given semiconductor has an optimized turn-on and turn-off times.

In the attainment of the foregoing objects, the invention contemplates in its preferred embodiment, a drive circuit coupled to the base of transistors connected in parallel in a circuit network. The transistors each have distinct turn-on, turn-off, and total on-time periods when their respective bases are simultaneously pulsed. The circuit network includes a source of power coupled through the parallel connected transistors to a load. The drive circuit includes a transistor base pulse signal source having a predetermined period coupled respectively through a time adjustable circuit to the base of a first transistor and to the base of a second transistor. The time adjustable circuit includes a first means to alter the initiation of the first transistor turn-on time period to thereby allow the end of the turn-on time period of the first transistor to coincide with the end of the second transistor turn-on time period. A second means is electrically coupled to the first means to initiate a signal at a point in time after the start of each base pulse signal represented by the difference in the turn-on times of the first and second transistor. The signal from the second means remains for a time period equal to the base pulse signal period less the aforementioned difference in turn-on times of the first and second transistor.

A third means is coupled to the second means and is responsive to the end of the second means signal to alter the initiation of the turn-off of the first transistor to thereby allow the turn-off of the first transistor to coincide with the end of the second transistor turn-off time period. From the foregoing description, it should be apparent that the time adjustable circuit is adjusted such that the total on-time of the first transistor matches the total on-time of the second transistor to thereby ensure equal current at all times through the transistors to the load.

In another embodiment of the invention, there is provided a drive circuit for a three electrical contact semiconductor in a circuit having a power source connected to a first electrical contact of the semiconductor and a load connected to a third electrical contact of the semiconductor. The drive circuit includes a logic signal source. A positive feedback circuit is electrically coupled between the first electrical contact and a second electrical contact of the semiconductor. A resonant, impulse current turn-on circuit is coupled to the second electrical contact and is controlled by the logic signal source. A resonant, impulse current turn-off circuit is coupled to the second electrical contact and is controlled by the logic signal source. A fixed current level turn-on circuit is coupled to the second electrical contact and is controlled by the logic signal source. The final component of the drive circuit takes the form of a turn-off steady state reverse bias circuit coupled to the second electrical contact and controlled by the logic signal source. The foregoing drive circuit provides optimum turn-on and turn-off time rates for the semiconductor.

Other objects and advantages of the present invention will be apparent upon reference to the accompanying description when taken in conjunction with the following drawings:

BRIEF DESCRIPTION OF DRAWINGS

FIG. 10a is an illustration of a series resonant turn-on circuit found in FIG. 10, FIG. 10b is an illustration of a series resonant turn-off circuit found in FIG. 10.

BEST MODE FOR CARRYING OUT THE INVENTION

Figure 1:
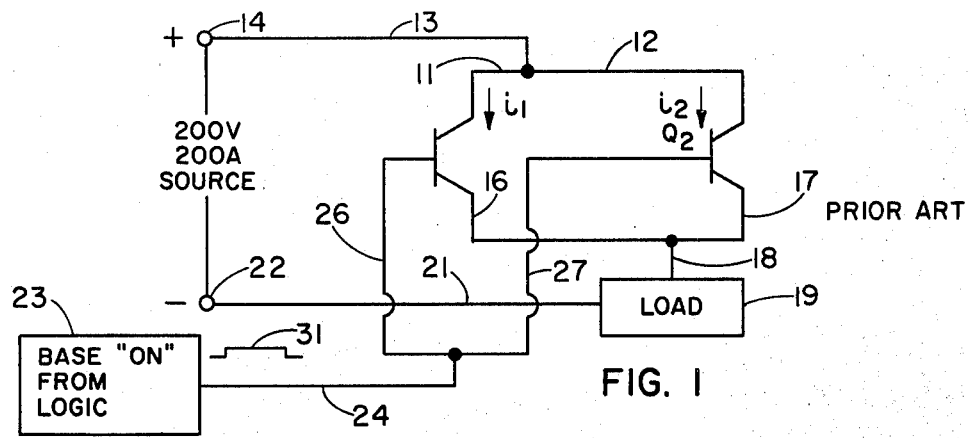
FIG. 1 illustrates the prior art.

Reference is now made to FIG. 1 in which there is illustrated a prior art circuit which is set forth here to explain the nature of the operational phenomenon to which the invention addresses itself. In FIG. 1, there is seen a circuit with one side of transistors $Q_1$ and $Q_2$ connected in parallel respectively by electrical leads 11 and 12 to lead 13. Lead 13 is shown terminated with a positive power terminal 14. The other side of the transistors $Q_1$, $Q_2$ are respectively connected by leads 16 and 17 to lead 18. Lead 18 is connected to a load 19. The load 19, in turn, is connected via lead 21 to negative power terminal 22. For purposes of this example, there is shown a 200 V, 200 amp power supply impressed across the power terminals 14 and 22. It should be noted that power supply may be of any value, but for purposes of this example it has been set at arbitrarily high value of 200 V, 200 amps. A trigger signal source 23 provides a base "on" signal from a logic network via leads 24, 26 to the base of transistor $Q_1$ and via lead 24, 27 to the base of transistor $Q_2$.

Figure 2:
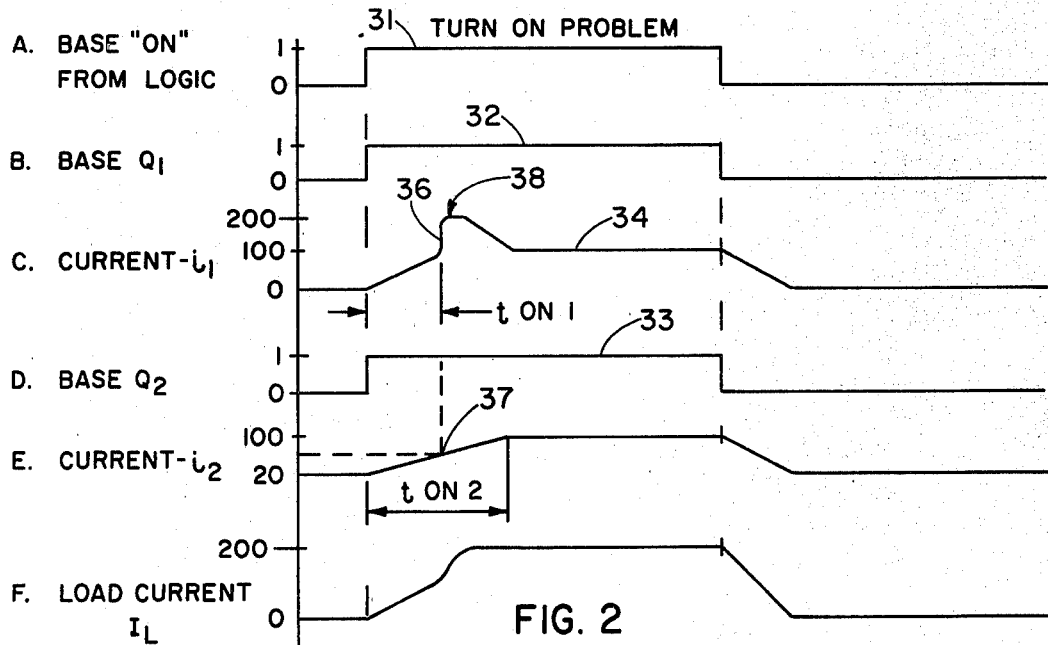
FIG. 2 is a signal timing chart depicting a turn-on problem that arises in the circuit of FIG. 1.

In order to appreciate the nature of the problem that this invention is directed to remedying, attention is now directed to FIG. 2 which illustrates a signal timing chart that depicts a turn-on problem that arises in the prior art circuit of FIG. 1. The signal delivered by the trigger signal source 23 is shown on line A of FIG. 2. The trigger signal is represented by curve 31 which takes a conventional square wave configuration.

It is well recognized that the current carrying capabilities of transistors tends to be limited and that should a current be applied to and through a transistor at a level in excess of the transistors rating, there will be a resultant burnout of the transistor. The parallel transistor arrangement of FIG. 1 has been selected in order to allow the division of current between and through transistors $Q_1$ and $Q_2$. In the prior art example, for purposes of illustration only, transistors $Q_1$ and $Q_2$ have been shown connected in parallel with the designed intention that the transistors $Q_1$ and $Q_2$ equally share the 200 V, 200 amp current applied across to the power terminals 14 and 22. The parallel connection of FIG. 1 is to ensure that current through $Q_1$; namely, current $i_1$ equals 100 amps and the current through transistor $Q_2$; namely, current $i_2$ equals 100 amps. Theoretically, the simultaneous appearance of a trigger signal 31 from the trigger signal source 23 to the transistor bases of $Q_1$ and $Q_2$ should result in the equal division of current through these transistors. In practice, however, this ideal design situation tends not to arise in the dynamic operation of a circuit such as that depicted in FIG. 1.

Turning once again to FIG. 2, there is shown a square wave curve 32 on line B of this figure. It can be seen that the base $Q_1$ signal represented by curve 32 is exactly in sync with the trigger signal curve 31. It will also be observed in FIG. 2 at line D of this figure that the base of transistor $Q_2$ receives the square wave curve signal 33 at exactly the same instant that the base of transistor $Q_1$ receives its signal.

Each commercially available transistor is known to have a designed turn-on time that in reality may vary from transistor to transistor. Accordingly, transistors with designed and specified equal turn-on times may, in fact, provide mismatched turn-on times when employed in a circuit such as that of FIG. 1. The curve illustrated at line C of FIG. 2 is intended to show that the current $i_1$ through the transistor $Q_1$ rises from 0 to 100 amperes over the period of time designated $t_{on\ 1}$. At line E of FIG. 2, it can be seen that the current through the transistor $Q_2$ rises from 0 to 100 amps over a period of time shown here as $t_{on\ 2}$. Accordingly, the current $i_1$ reaches a full "on" condition of 100 amps as is indicated by the point 36 on the curve 34. With the current at $i_1$ at the level indicated by the reference numeral 36 i.e. 100 amps, it can be seen that the current $i_2$ at this instant designated by reference numeral 37 is at a value somewhere between 0–100 amps. At the instant in time represented by the reference numerals 36 and 37, it should be observed that the current $i_1$ passing through the transistor $Q_1$ is then at the rated capacity of the transistor $Q_1$; but since the transistor $Q_1$ is at this instant under full conduction, there is a tendency for the current to increase through the transistor $Q_1$ as is indicated by the arrow associated with reference numeral 38. The current curve $i_1$ is shown in an exaggerated form in order to convey an awareness that for a brief instant in time following the point in time, indicated by reference numeral 36, the current $i_1$ increases rapidly and tends to approach the total 200 amps impressed across the parallel connected transistors $Q_1$ and $Q_2$. This sudden rise in current as indicated by reference numeral 38 tends to burnout the transistor $Q_1$ which results in all of the current being transferred to and through the transistor $Q_2$ which, in turn, is required to carry a current greater than its capacity and it, too, burns out. Because the transistors $Q_1$ and $Q_2$ were not matched in respect of their turn-on times, there is what will be defined in this specification as a turn-on problem. The invention to be described hereinafter, completely remedies this turn-on problem even when transistors with nonmatched turn-on times are employed.

Figure 3:
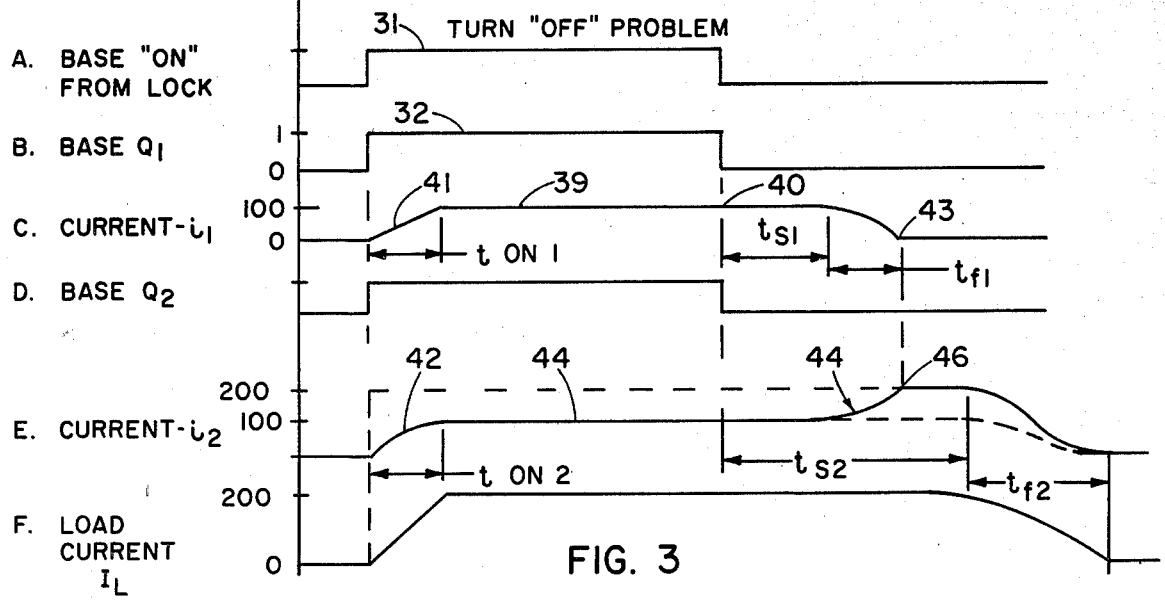
FIG. 3 is a signal timing chart depicting a turn-off problem that arises in the circuit of FIG. 1.

Reference is now made to FIG. 3 in which there is illustrated a signal timing chart that depicts a turn-off problem that arises in the prior art circuit of FIG. 1. In describing the signal timing chart of FIG. 3 wherever the signals shown in FIG. 3 are the same as FIG. 2, identical reference numerals will be employed. Accordingly, at line A of FIG. 3 there is shown a base "on" signal from the logic signal source 23 that is represented by the square wave form curve 31. At line B the condition of the base $Q_1$ is represented by the curve 32. Attention is now directed to lines C and E of FIG. 3 in which there is respectively shown the currents $i_1$ and $i_2$. In the example being described it is assumed for purposes of this discussion that the turn-on times for both transistors $Q_1$ and $Q_2$ are equal and that the rise time curves 41, 42 of currents $i_1$, $i_2$ are matched. Attention is now redirected to line C of FIG. 3 and the right hand portion of curve 39 where there can be seen that at a point and time coincident with the disappearance of the transistor base $Q_1$ signal 32 of line B, there begins at point 40 of curve 39 the turn-off of the transistor $Q_1$. The turn-off of $Q_1$ takes a timed interval represented by $t_{s1}$ plus $t_{f1}$. The $t_{s1}$ signal represents the current storage time inherent in transistor $Q_1$, while $t_{f1}$ represents the fall time inherent in transistor $Q_1$. Turning now to line E of FIG. 3, it will be observed that the right hand portion of current $i_2$ curve 44 has at its right hand end a different total turn-off time for transistor $Q_2$ than the total turn-off time for transistor $Q_1$. The total turn-off time for transistor $Q_2$ is equal to $t_{s2}$ plus $t_{f2}$. It can be seen on the curve 39 of line C that a point 43 the current $i_1$ has fallen to zero prior, in time to the current $i_2$ of transistor $Q_2$ having begun its fall time $t_{f2}$. Because the current $i_1$ of $Q_1$ at point 43 on the curve 39 has reached a zero current level, there will be an immediately evidenced rise in current through transistor $Q_2$ as indicated by the referenced numeral 44 and its associated arrow. This rise in current of $i_2$ is to be expected since all of the current is now permitted to pass to and through transistor $Q_2$ resulting in a peak current approaching 200 amps as indicated by curve 46, which results is transistor $Q_2$ burning out.

It should be appreciated that both the turn-on problem and the turn-off problem just discussed may simultaneously be present whenever two or more semiconductor units are connected in parallel between a source of power and a load. The invention to be described hereinafter completely remedies the turn-off problem as well as has been noted the turn-on problem.

Figure 4:
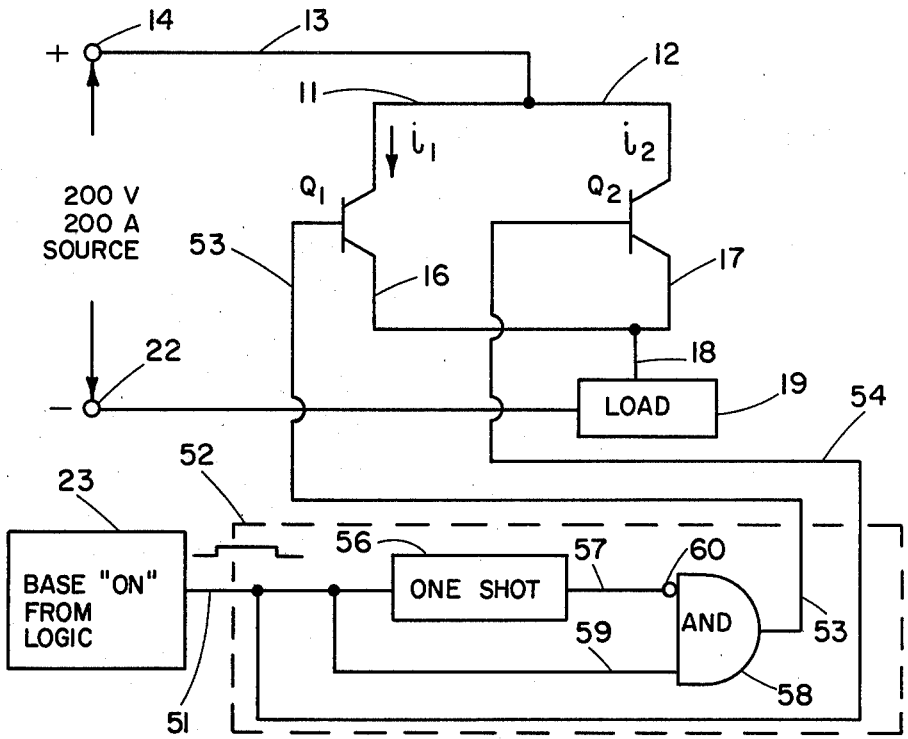
FIG. 4 depicts a parallel transistor circuit in combination with a turn-on drive circuit embodying the invention.

Reference is now made to FIG. 4 which depicts a parallel transistor circuit in combination with a turn-on drive circuit embodying the invention. In the description of FIG. 4 wherever possible, reference numerals designating components described earlier will be used again to describe like components. From the description preceeding, it is apparent that transistors $Q_1$ and $Q_2$ are connected in parallel between a 200 V, 200 amp source of power across power terminals 14, 22 by leads 11, 12, and 13 to one side of transistors $Q_1$ and $Q_2$. The other side of transistors $Q_1$ and $Q_2$ are connected by leads 16, 17 respectively to lead 18 and load 19. A trigger signal source 23 is provided and the output from the trigger signal source 23 is delivered over lead 51 to a drive circuit 52 shown in dotted outline. The drive circuit 52 includes a pair of outputs that appear on leads 53 and 54 and are connected respectively to the base of transistors $Q_1$ and $Q_2$. The drive circuit 52 includes a one shot monostable multivibrator 56, the function of which will be described in detail hereinafter. The input of the one shot multivibrator 56 is connected by the lead 51 to the trigger signal source 23. One shot multivibrator 56 has an output connected via lead 57 to an AND gate 58. The output of the AND gate 58 is connected to the base of transistor $Q_1$ by lead 53. The base of transistor $Q_2$ is shown connected directly to the output lead 51 from the trigger signal source 23 via lead 54.

Figure 5:
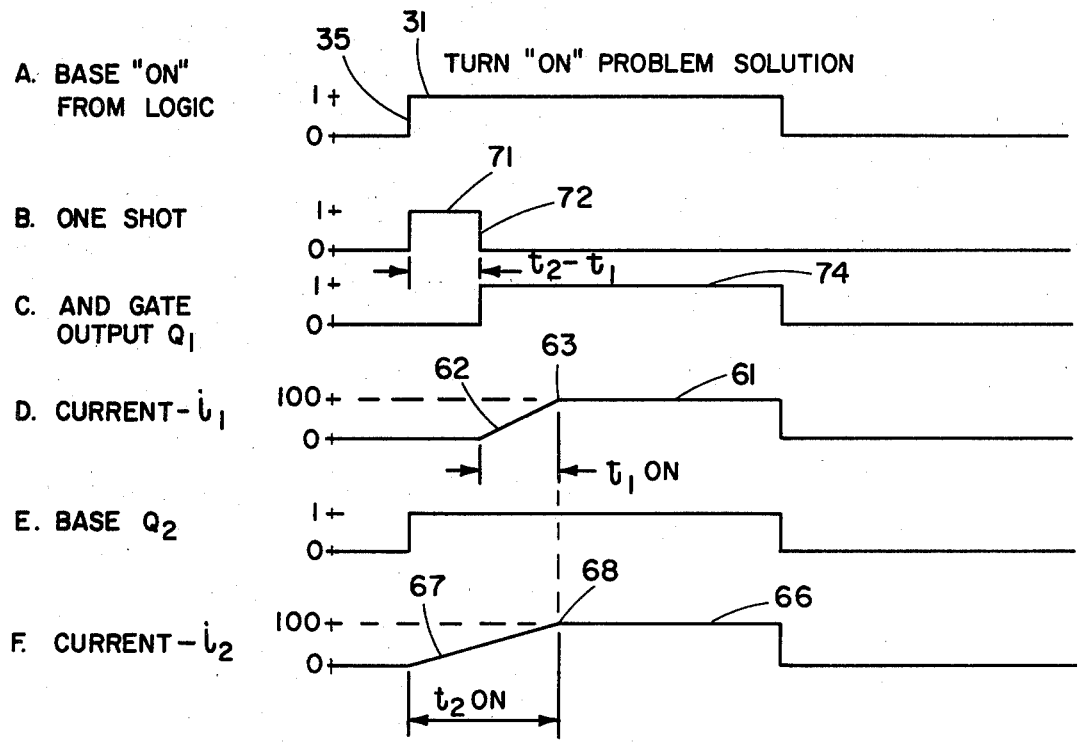
FIG. 5 is a signal timing chart depicting the turn-on problem solution provided by the drive circuit of FIG. 4.

Reference is now made to FIG. 5 which is a signal timing chart depicting a turn-on problem solution provided by the drive circuit 52 of FIG. 4. Attention is initially directed to the curves presented in lines D and F of FIG. 5 which illustrate currents $i_1$ and $i_2$ respectively. Current $i_1$ illustrated by curve 61 on line D is shown having a rise time $t_{1on}$ as evidenced by rise time curve portion 62. Current $i_2$ illustrated by curve 66 on line F shows a turn-on time $t_{2on}$ spanning the portion of time represented by rise time curve portion 67. It should be noted for purposes of this example that the turn-on time $t_{1on}$ of the transistor $Q_1$ is shorter than the turn-on time $t_{2on}$ of transistor $Q_2$. This is the same condition that is set forth in respect of the prior art turn-on problem example of FIG. 1 and 2. It will be observed that the base "ON" signal represented by curve 31 of line A of FIG. 5 if delivered simultaneously to the bases of transistors $Q_1$ and $Q_2$ will result in the transistor burnout condition described earlier. Accordingly, in this example it should be visually apparent from the position of current curves 61, 66 of lines D and F of FIG. 5 that the problem will disappear if transistor $Q_1$ experiences a turn-on time period such that at the end of rise time curve 62 at point 63 is coincident in time with the end of rise time curve 67 and the point 68. With the current $i_1$ and $i_2$ at the level indicated by reference numerals designating points 63 and 68, both transistors $Q_1$ and $Q_2$ will be in an instantaneous state of full conduction and the burnout problem is remedied. In order to accomplish this state of simultaneous instantaneous conduction by $Q_1$ and $Q_2$, it should be observed that transistor $Q_1$ having the shorter turn-on time $t_1$ must be fired into conduction at a point in time delayed from the appearance of the positive going edge 35 of curve 31. This is accomplished by inserting in the electrical connection between the trigger signal source 23 and the base of $Q_1$ the one shot multivibrator 56 which has an on-time selected such that its on-time is measured by the difference in the turn-on time of transistor $Q_2$ and the turn-on time of transistor $Q_1$, namely, $t_{2on} - t_{1on}$.

Attention is now directed to lines A and B of FIG. 5 where it is seen that when the signal from the trigger signal source signal 23 represented by curve 31 is delivered via lead 51 to one shot multivibrator 56 there results a pulsed output represented by curve 71. The pulsed output represented by curve 71 is delivered via lead 57 to one input of AND gate 58. There is also shown in the drive circuit 52 a lead 59 connecting lead 51 with a second input to the AND gate 58. There is of course, appearing on lead 51 and 59 the signal represented by curve 31 on line A in FIG. 5, and the AND gate 58 will only provide an output as shown on line C of FIG. 5 and represented by curve 74 when the negative falling edge 72 of curve 71 is presented at bubble logic symbol 60 of AND gate 58. At that instant in time, the AND gate 58 output represented by curve 74 appears on lead 53 to the base of transistor $Q_1$. The appearance of the positive going signal represented by curve 74 at the base of transistor $Q_1$ initiates the turn-on of transistor $Q_1$ resulting in the full-on conduction of transistor $Q_1$ at point 63 of curve 61 after rise time $t_{1on}$ represented by curve 62. The full-on conduction of transistor $Q_2$ is designated by the point 68 on the curve 66.

From the foregoing description it can be seen that the turn-on problem described in respect of FIG. 1 and 2 has been solved. Transistor burnout will be completely avoided by merely measuring the actual turn-on time of the transistors employed and then selecting a time delay device such as the one shot described, which time delay device will have the required delay necessary to cause simultaneous conduction.

It should be understood that the invention presented here transcends in principle the example utilized in its explanation and that those skilled in the electrical arts once schooled in the inventive principle could readily design logic circuits for three or more semiconductors connected in parallel.

Figure 6:
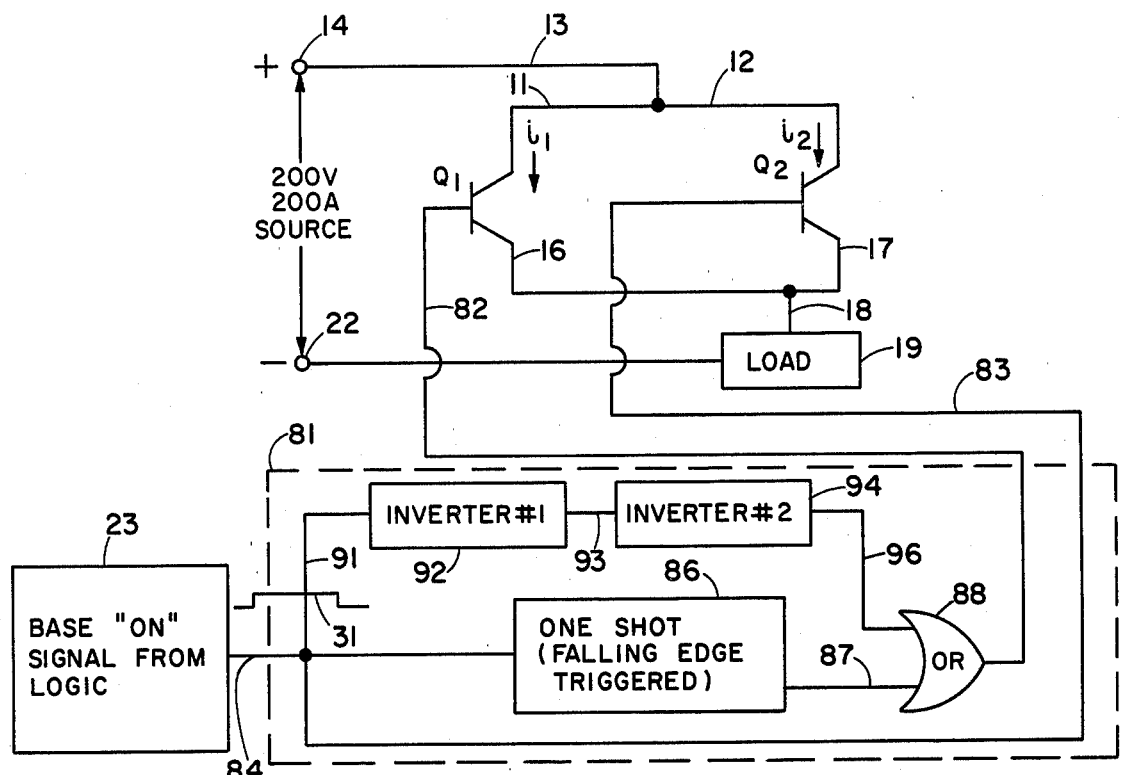
FIG. 6 depicts a parallel transistor circuit in combination with a turn-off drive circuit embodying the invention.

Reference is now made to FIG. 6 which depicts a parallel transistor circuit in combination with a turn-off drive circuit 81 embodying the invention. Transistors $Q_1$ and $Q_2$ are arranged in the same fashion as described in respect of FIGS. 1 and 4. The turn-off drive circuit 81 at its output side has electrical connections by way of leads 82, 83 connected to the respective bases of transistors $Q_1$ and $Q_2$. A trigger signal source 23 is connected to the input side of the turn-off drive circuit 81 by lead 84. A falling edge triggered one shot monostable multivibrators 86 is connected on its input side to the trigger signal source 23 via lead 84. The output of the one shot multivibrator 86 appears on lead 87 and provides one input to OR gate 88. The OR gate 88 has a second input delivered from the trigger signal source 23 via lead 84, lead 91, number 1 inverter 92, lead 93, number 2 inverter 94, and finally lead 96.

Figure 7:
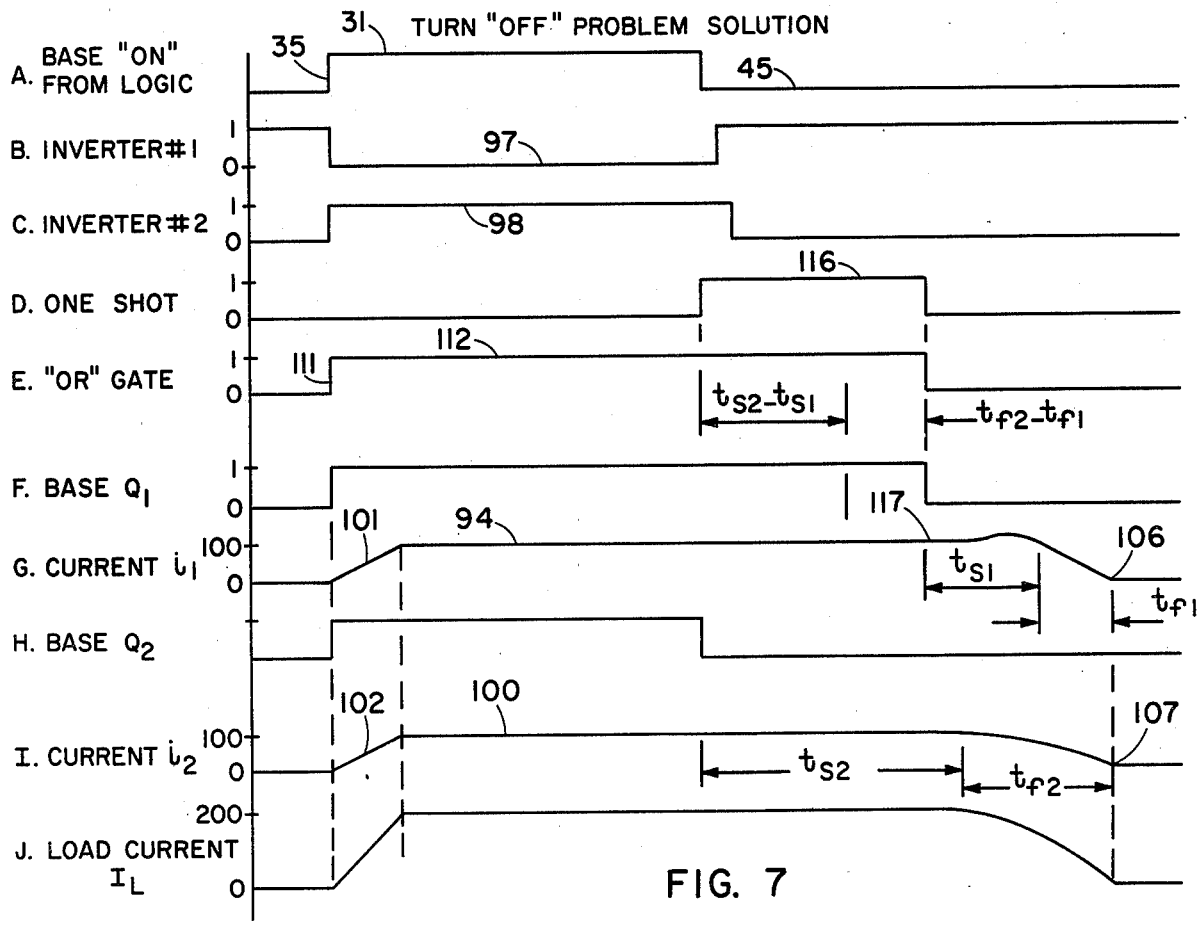
FIG. 7 is a signal timing chart depicting a turn-off problem solution provided by the drive circuit of FIG. 6.

Reference is now made to FIG. 7 which is a signal timing chart depicting a turn-off problem solution provided by the drive circuit 81 of FIG. 6. At line A of FIG. 7 there is shown the base "ON" signal curve 31 from the trigger signal source 23. Lines B and C illustrate the resultant waveforms 97, 98 of number 1 inverter and number 2 inverter designated by reference numerals 92 and 94 in FIG. 6.

Attention is next directed to the curves illustrated in lines F, G, H and I, with particular attention to the rise time curve portions 101, 102 of the current $i_1$ and $i_2$ of curves 99 and 100. For purposes of this example, it will be assumed that the rise times for transistors $Q_1$ and $Q_2$ are perfectly matched and the turn-on problem noted in respect of FIGS. 4 and 5 is not present. For purposes of this example, the turn-off time of transistor $Q_1$ has been selected to be shorter than the turn-off time of transistor $Q_2$. This difference in turn-off times is graphically shown at the right hand ends of current $i_1$ curve 99 and current $i_2$ curve 100. The total turn-off time for transistor $Q_1$ is measured by the sum of the transistor $Q_1$ storage time $t_{s1}$ plus the transistor $Q_1$ fall time $t_{f1}$. The turn-off time for transistor $Q_2$ is measured by the transistor $Q_2$ storage time $t_{s2}$ plus the transistor $Q_2$ fall time $t_{f2}$. It will be recalled in the explanation of FIG. 1 that in the absence of the drive circuits of this invention the rising edge 35 of curve 31 from the trigger signal source 23 delivered to the bases of transistors $Q_1$ and $Q_2$ causes these transistors $Q_1$ and $Q_2$ to begin conduction. In a similar fashion, the negative going trailing edge 45 of curve 31 if delivered to the bases of transistors $Q_1$ and $Q_2$ results in the initiation of turn-off of these transistors. Because the turn-off time of transistor $Q_1$ is shorter than the turn-off time of transistor $Q_2$, should both transistors be turned off at the same instant, the turn-off problem of FIG. 3 will manifest itself and there will be a burnout of the transistor $Q_2$. It should be visually apparent that in order to preclude the turn-off of transistor $Q_1$ from occurring such that burnout problem previously described arises, transistor $Q_2$ will have to have its turn-off time delayed by a time sufficient to allow the simultaneous zero conduction state indicated by reference numerals 106 and 107 indicated at the right hand ends respectively of curves 99 and 100. The delay necessary is measured, as can be observed, at line E of FIG. 7 where the total delay required is $(t_{s2} - t_{s1}) + (t_{f2} - t_{f1})$. The positive going edge 35 of the curve 31, line A, from the trigger signal source 23 delivered via lead 84, 91, number 1 inverter 92, lead 93, number 2 inverter 94, lead 96 to the input of OR gate 88 results in the turn-on of transistor $Q_1$ by delivery of the positive going edge 111 of signal curve 112 to the OR gate 88. The falling edge triggered one shot monostable multivibrator 86 is triggered into conduction by the appearance of the negative trailing edge 45 of the trigger signal source curve 31. The output of the one shot 86 is shown on line D of FIG. 7 as curve 116. It will be observed that the OR gate 88 has provided an input on lead 96 which continues to a point in time when the number 2 inverter 94, signal 98 goes away, at slightly prior to this instant the OR gate 88 receives the one shot output represented by curve 116 and there remains as can be seen at the right hand end of curve 112 an OR gate output signal for a period of time that continues for the time period $(t_{s2}-t_{s1})+(t_{f2}-t_{f1})$. It is graphically apparent here that the delay time selected for the one shot monostable multivibrator 86 must be selected to match the time period measured by $(t_{s2}-t_{s1})+(t_{f2}-t_{f1})$. With a one shot monostable multivibrator 86 having the time period just described, the base of transistor $Q_1$ will begin its turn-off time as indicated in time by the point 117 on the curve 99 of line G of FIG. 7.

From the foregoing description it can be seen that the turn-off problem described in respect of FIGS. 1 and 3 has been solved. Transistor burnout will be completely avoided by merely measuring this actual turn-off time of the transistors employed and then selecting a time delay device that will have the required delay necessary to cause simultaneous conduction.

Figure 8:
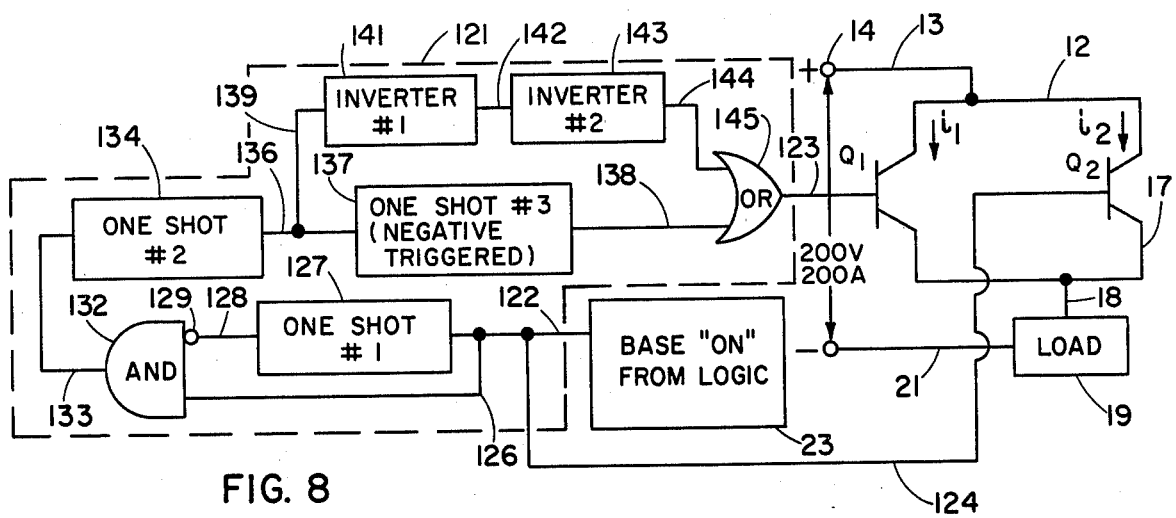
FIG. 8 is a preferred embodiment of a drive circuit for parallel nonmatched transistor that contains the invention.

Reference is now made to FIG. 8 which illustrates a preferred embodiment of a drive circuit 121 for parallel nonmatched transistors $Q_1$ and $Q_2$. Transistors $Q_1$ and $Q_2$ are interconnected as heretofore described in respect of FIGS. 1, 4 and 6. A drive circuit 121 is electrically connected at its input side to trigger signal source 23 by lead 122. The drive circuit 121 is connected at its output side respectively to the bases of transistors $Q_1$ and $Q_2$ by leads 123, 124. The trigger signal source 23 is electrically connected respectively to an AND gate 132 by leads 122, 126, and by lead 122, number 1 one shot multivibrator 127, lead 128 and the logic bubble 129 of AND gate 132. The AND gate 132 has an output lead connected via lead 133 to number 2 one shot multivibrator 134. The number 2 one shot multivibrator 134 in turn is electrically connected to an OR gate 145 through separate electrical paths. One path includes lead 136, number 3 one shot multivibrator 137 and lead 138 electrically connected to the OR gate 145. The other path includes lead 136, lead 139 number 1 inverter 141, lead 142 number 2 inverter 143, and lead 144 which is electrically connected to the OR gate 145. The OR gate 145 has its output electrically connected to lead 123 which in turn is connected to the base of transistor $Q_1$.

Figure 9:
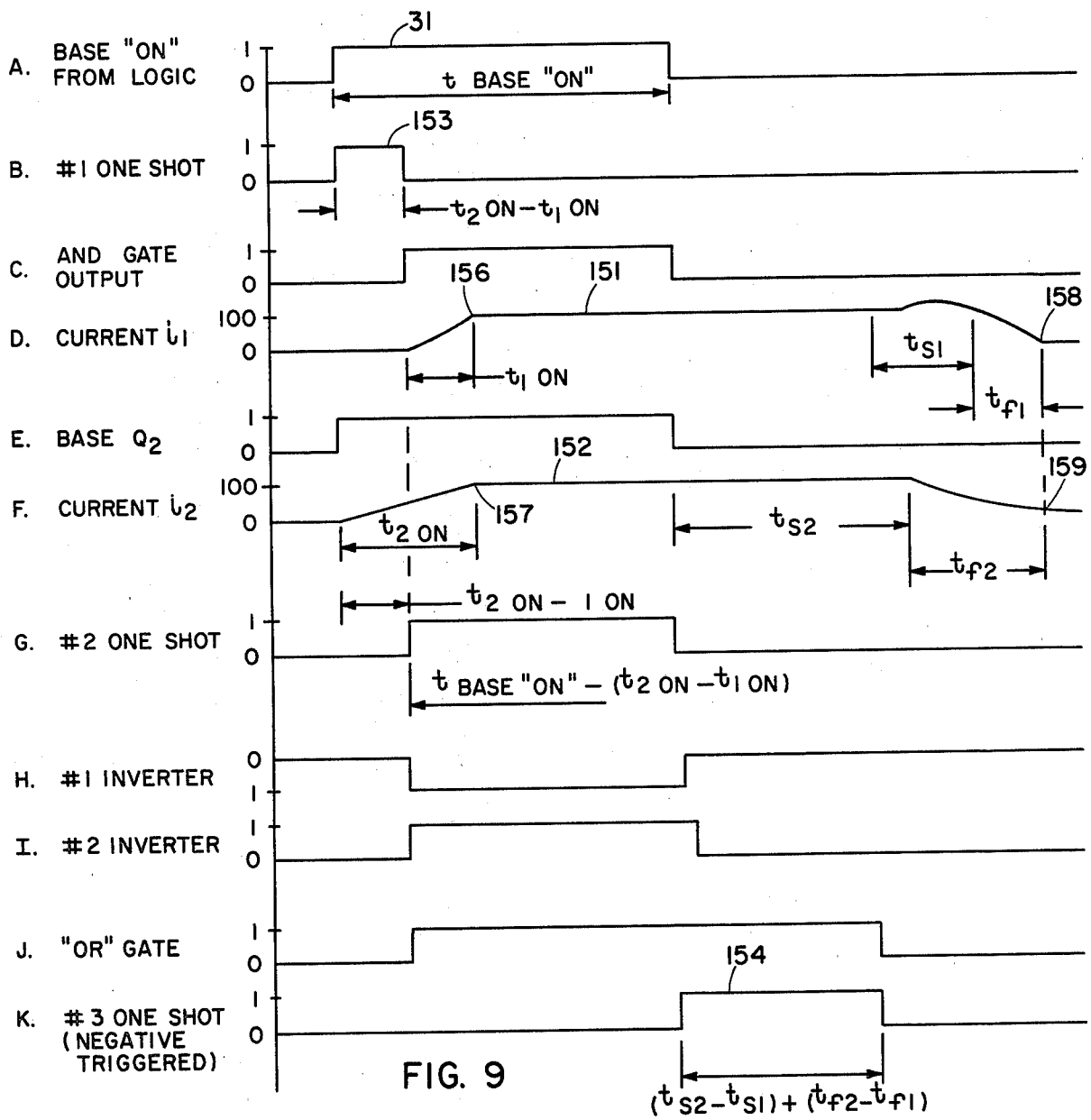
FIG. 9 is a signal timing chart that illustrates the signals present in the circuit of FIG. 8.

Reference is now made to FIG. 9 which is a signal timing chart that illustrates both the turn-on, turn-off problem solution provided by the circuit of FIG. 8.

In the parallel transistor circuit environment illustrated in FIG. 8, for purposes of this example, it is assumed that the turn-on time and turn-off times of transistor $Q_1$ and $Q_2$ are not matched. For purposes of this example it is assumed that the turn-on time for transistor $Q_1$ is shorter than the turn-on time for transistor $Q_2$, and the turn-off time for transistor $Q_1$ is shorter than the turn-off time for transistor $Q_2$. Under this set of assumptions there will arise the maximum possibility of transistor burnout. It should be evident when reviewing the curve 151 of line D of FIG. 9 which curve 151 represents the current $i_1$ through transistor $Q_1$, that this curve possesses the turn-on characteristics of the curve 61 of FIG. 5 and the turn-off characteristics of the curve 99 of FIG. 7. Curve 152 of line F of FIG. 9 possesses the turn-on characteristics of curve 66 of FIG. 5 and the turn-off characteristics of curve 100 of FIG. 7. The drive circuit 121 provides a logic network that will generate a time delay pulse curve 153 as a result of the circuit arrangement that includes number 1 one shot 127 and AND gate 132. The generation of the time delay pulse curve 153 is as described in conjunction with FIG. 5 and the drive circuit 52 of FIG. 4. The appearance of time delay pulse curve 153 remedies the turn-on problem present because of the turn-on time mismatch of transistors $Q_1$ and $Q_2$.

The turn-off problem is remedied by the appearance of the time delay pulse curve 154 of line K which time delay pulse curve 154 is generated by the circuit that includes number 3 one shot 137, number 1 inverter 141, number 2 inverter 143 and OR gate 145. The operation of this last mentioned circuit is as was described in respect of the drive circuit 81 of FIG. 6. The appearance of the time delay pulse curve 154 remedies the turn-off problem that arises due to the mismatch in turn-off times of transistors $Q_1$ and $Q_2$ as evidenced by circuit curves 151 and 152. The descriptions referred next above is directed to the solution of both the turn-on and turn-off problems, but does not cover or treat the period of time in which both transistors $Q_1$ and $Q_2$ are in a full conduction state between the periods of turn-on and turn-off. In this example, it will be evident that the transistor $Q_2$ is triggered into conduction as a result of the appearance of trigger signal curve 31 from trigger signal source 23 delivered via leads 122 and 124 to the base of $Q_2$. The trigger signal curve 31 as shown in line A of FIG. 9 has a total on-time designated $t_{base"on"}$. In order to insure simultaneous initiation of turn-off, the number 2 one shot 134 must have a period of time selected such that its on-time equals $t_{base"on"}-(t_{2"on"}-t_{1"on"})$. With the drive circuit 121 in operation as has been described, it will be observed that the $i_1$ current curve of line D and the $i_2$ current curve of line F having as indicated respectively at points 156 and 157, the coincident state of full conduction. In a like manner, the points 158 and 159 of $i_1$ current and $i_2$ current of lines D and F are in a simultaneous zero or in the current off condition.

In the preferred embodiment as set forth in FIG. 8, the worse state of affairs possible is illustrated in that there is a complete mismatch in turn-on and turn-off times. In practice one may find that transistors or semiconductors involved possess either matched turn-on or turn-off times, and in that event, the drive circuits of FIG. 4 or FIG. 6 may be employed to remedy the burnout problem and either one or both of the drive circuits 52, 81 shown in FIG. 4 and FIG. 6 may be combined as shown in FIG. 8 to insure that in respect of a pair of transistors or semiconductors the total on-time will be matched, and the semiconductor burnout problem removed.

Figure 10:
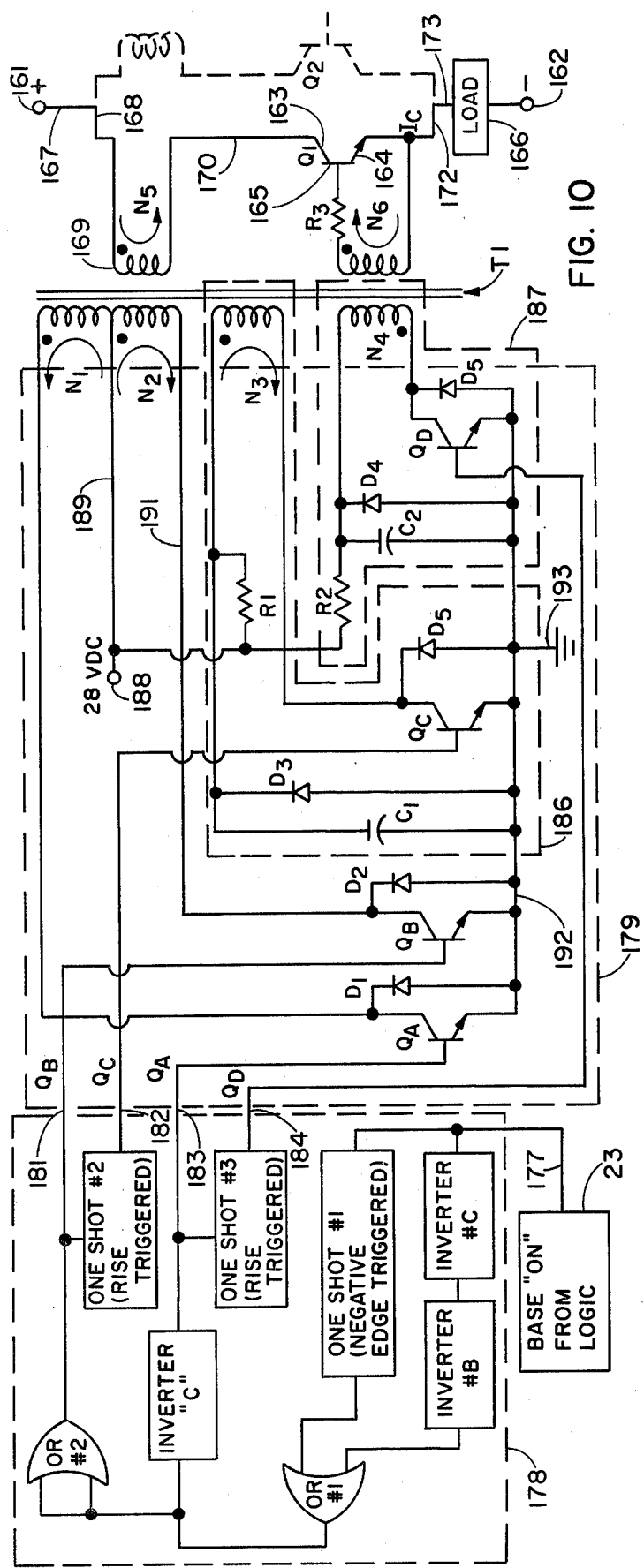
FIG. 10 depicts a drive circuit embodying the invention.
Figure 10:
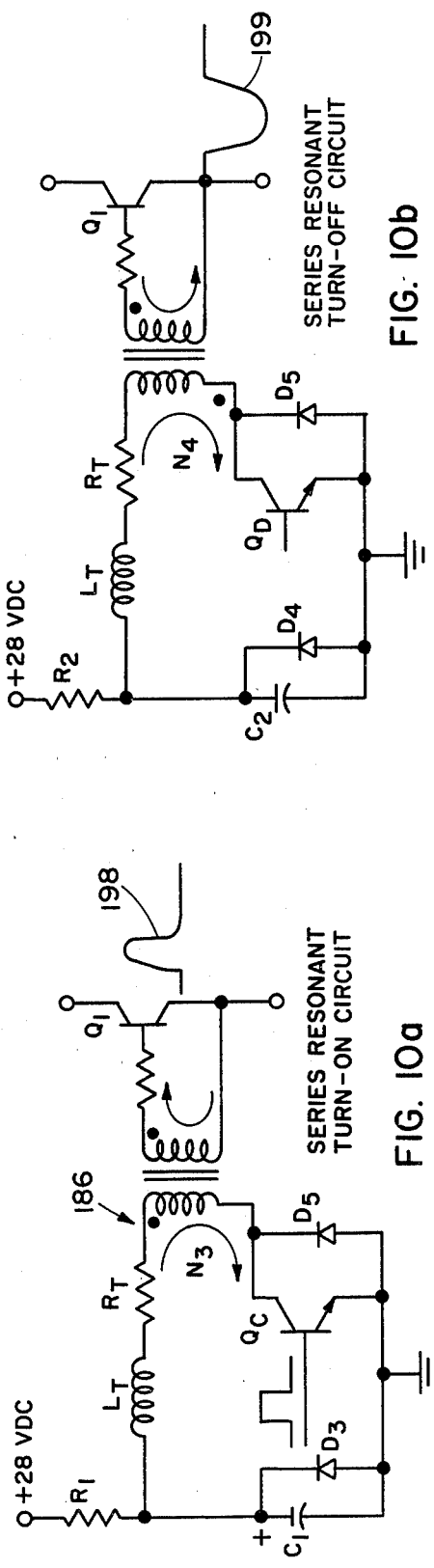

Reference is now made to FIG. 10 which depicts another embodiment of a drive circuit embodying the invention. The drive circuit includes a three electrical contact semiconductor in the form of transistor $Q'_1$, in a circuit having a power source delivered across terminals 161 across positive terminal 161 and negative terminal 162, and a second semiconductor in the form of transistor $Q'_2$ as shown in dotted outline connected in parallel to transistor $Q'_1$. Power delivered across positive and negative terminals 161, 162 is delivered to a load 166. The power source is connected to a first electrical contact 163 of transistor $Q'_1$ and a third electrical contact 164 of transistor $Q'_1$ via leads 167, 168, positive feedback transformer winding 169 and lead 170 to first electrical contact 163. The first electrical contact 163 is electrically coupled to a second electrical contact 165 of the transistor base $Q'_1$ and the third electrical contact 164 is coupled to the base of transistor $Q'_1$ and electrically connected to leads 171, 172 and 173 to the load 166, which load 166 is electrically connected in turn to the negative power terminal 162. The drive circuit of FIG. 10 includes the following basic componants: a logic signal source 178 shown in dotted outline at the left hand end of FIG. 10. The logic signal source 178 is electrically connected to a transformer coupled drive circuit 179 shown in dotted outline at the center of FIG. 10, by electrical leads 181, 182, 183 and 184.

The transformer coupled drive circuit 179 includes a positive feedback circuit electrically coupled between the first electrical contact 163 and the second electrical contact 165 of the transistor $Q'_1$. This positive feedback circuit is provided through transformer winding N5 for reasons that will become apparent and be explained more fully hereinafter. The transformer winding N5 bears the additional designation of reference numerals 169. This positive feedback through the winding N5 will provide for better efficiency at partload.

A resonant impulse current turn-on signal circuit 186 shown in dotted outline is coupled through transformer winding N3 to the second electrical contact 165 and is controlled by the logic signal source 178. The details of the resonant impulse turn-on signal circuit 186 are set forth in FIG. 10a and will be explained more fully hereinafter.

A resonant impulse current turn-off signal circuit 187 shown in dotted outline provides an impulse turn-off signal through winding N4 of a value greater than the turn-on pulse to provide effective rapid turn-off and overcome the positive feedback portion of the base current to transistor $Q'_1$. The resonant impulse current circuit turn-off signal 187 is coupled through winding N4 to the second electrical contact 165 and is controlled by the logic signal source 178 in a manner to be described more fully hereinafter, when FIG. 10b is described.

A fixed current level turn-on circuit is provided by a path from a 28 VDC source through leads 188, 189, transformer winding N2, lead 191, transistor diode combination $Q_B$, $D_2$, and lead 192 to ground 193. This fixed current level turn-on circuit is coupled via windings N2 and N6 through resistor R3 to the second electrical contact 165 of the base $Q'_1$.

The final component of the drive circuit is a turn-off steady state reversed bias circuit that is provided by a path through windings N1, transistor $Q_A$ for the steady state turn-off and reverse bias of transistor $Q'_1$. The drive circuit broadly described above provides optimum turn-on and turn-off rates for the transistor $Q'_1$.

Figure 11:
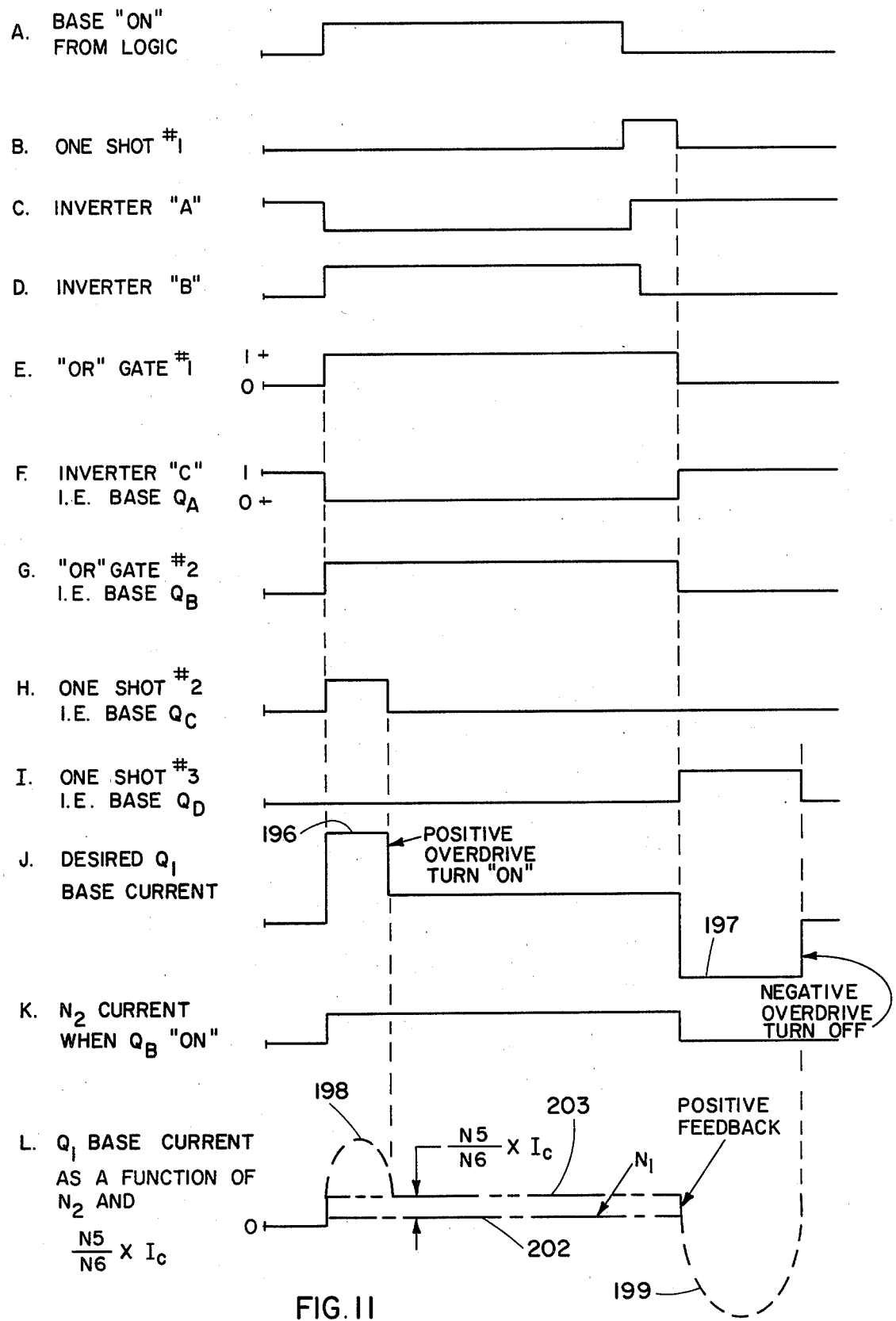
FIG. 11 is a signal timing chart that illustrates the signals present in the circuit of FIG. 10.

Reference is now made to FIG. 11 which is a signal timing chart that illustrates the signals present in the circuit of FIG. 10. At line J of FIG. 11, there is illustrated the desired ideal $Q'_1$ base current waveform. From the description proceeding in respect of the turn-on, turn-off problem, it should be recognized that in order to insure consistant definitive turn-on and turn-off times, the base current during the turn-on and turn-off times should be overdriven in order that the most rapid turn-on and turn-off occurs. Accordingly, at line J of FIG. 11 there is shown a positive overdrive turn-on square wave pulse 196 and a negative overdrive turn-off pulse 197. The drive circuit of FIG. 10 is intended to provide a close approximation of the desired $Q'_1$ base current shown on line J of FIG. 11. The resultant waveform of a $Q'_1$ base current provided by the drive circuit is shown on line L of FIG. 11. The positive overdrive turn-on signal provided to the base of $Q'_1$ as shown at line L of FIG. 11 is indicated by the reference numeral 198. The series resonant turn-on circuit 186 of FIG. 10a provides the waveform 198.

The series resonant turn-off circuit 187 of FIG. 10b provides the negative overdrive pulse 199 as shown at line L of FIG. 11. Reference is again made to FIG. 10 in which there is shown a trigger signal source 23 electrically connected to the logic signal source 178 via lead 177. The logic network illustrated in the logic signal source 178 illustrates an example of how the required logic signals that are essential to control the transformer coupled drive 179 can be generated. Returning to FIG. 11 the signal curve 31 illustrated on line A appears on lead 177 of FIG. 10. This is the same type of signal described with respect to FIGS. 2, 3, 5, 7 and 9. The signal present on lead 183 is shown at line F. The signal present on lead 181 is shown by the curve illustrated on line G. The signal present on lead 182 is shown by the signal illustrated on line H, and finally, the signal present on lead 184 is shown by the signal present on line I. The envelope of the signal shown at line L of FIG. 11 is made up of 4 separate and simultaneously provided signal portions. The current level represented by the curve 202 is a function of the number of turns of transformer winding N2, while the curve 203 is a function of the ratio of the transformer winding N5 to N6, times the collector current $I_C$ of the transistor $Q'_1$ plus the current level represented by curve 202. The positive overdrive turn-on current curve 198 is accomplished by the series resonant turn-on circuit of FIG. 10a. This series resonant turn-on signal circuit of 10a is conventional in nature. The series resonant turn-off circuit of 10b is a conventional circuit that provides the fourth and final component of the $Q'_1$ base current shown at line L of FIG. 11. With respect to FIGS. 10a and 10b, as well as FIG. 10, it will be noted that the resonant impulse turn-on signal circuit through the winding N3 required to speed up the turn-on is accomplished by the resonant combination of capacitors $C_1$ with the inductance $L_t$ of the transformer $T_1$. The turn-off pulse 199 is achieved by the combination of capacitor $C_2$ with the inductance $L_t$ of the transformer $T_1$. Charging of the capacitors $C_1$ and $C_2$ is provided by resistors $R_1$ and $R_2$ respectively, while diodes $D_3$ and $D_4$ provide for stopping the resonant conduction after the first half cycle.

Figure 12:
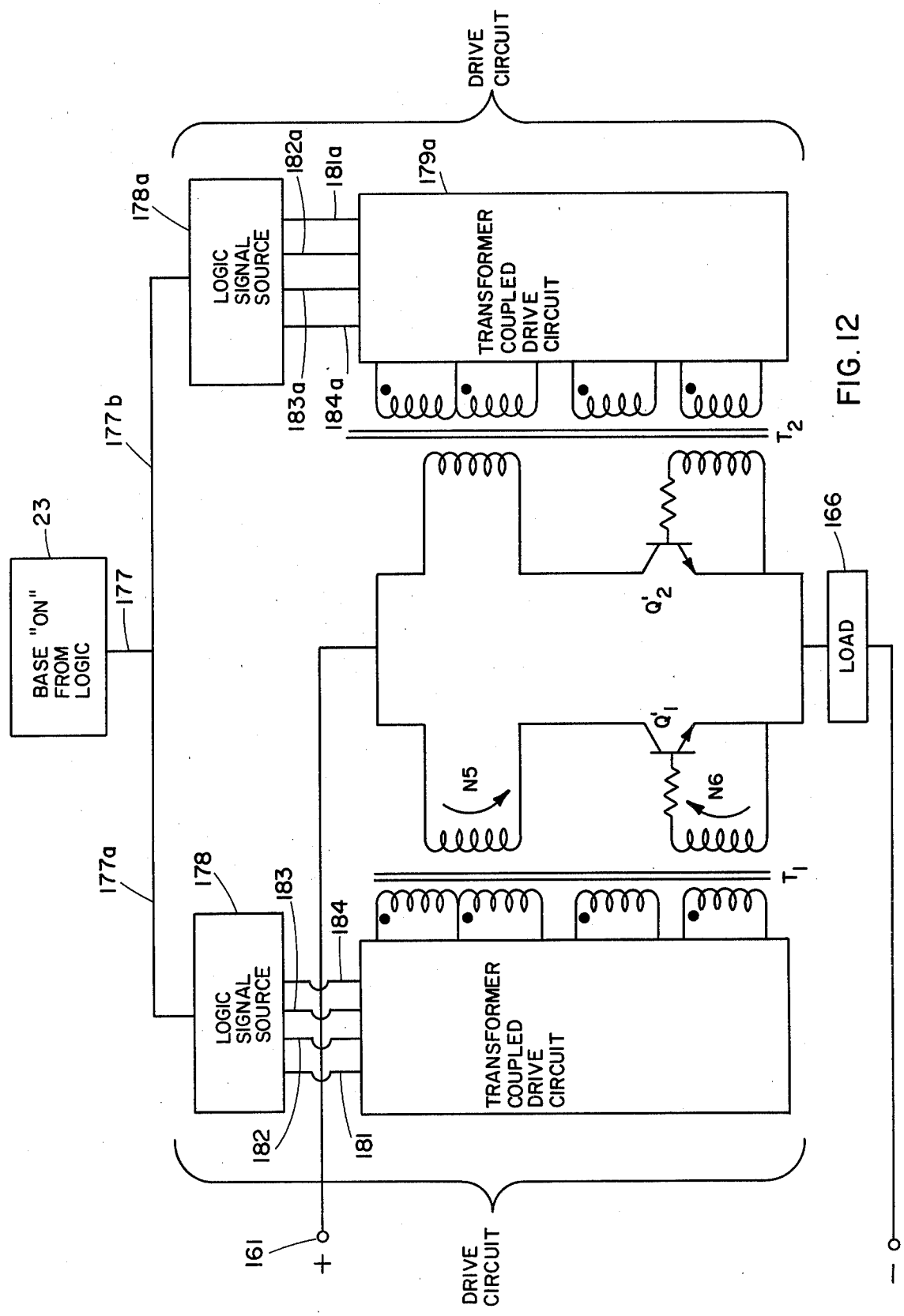
FIG. 12 illustrates how the drive circuit arrangement of FIG. 10 may be employed in a parallel transistor arrangement.

Reference is now made to FIG. 12 which shows in block diagram form how the drive circuits of FIG. 10 may be employed in a parallel transistor $Q'_1$ and $Q'_2$ arrangement.

In FIG. 10 transistor $Q'_2$ was shown in broken line fashion. In the brief description of FIG. 12 the same reference numerals used in FIG. 10 will be employed to designate the same components. Accordingly, a source of power is provided across positive and negative terminals 161 and 162. A trigger signal source 23 is shown electrically connected in parallel to logic signal source 178 and 178a via leads 177, 177a and 177b. The logic signal source 178 is electrically coupled to the transformer coupled drive circuit 179 via leads 181, 182, 183 and 184. In a similar fashion logic signal source 178a is electrically coupled to the transformer coupled drive circuit 179a via electrical leads 181a, 182a, 183a and 184a. Transformer $T_1$ and $T_2$ respectively couple the aforementioned drive circuits 179, 179a to transistor $Q'_1$ and $Q'_2$ as shown. The load 166 is provided power through parallel connected transistor $Q'_1$, $Q'_2$.

Although this invention has been illustrated and described in connection with the particular embodiments illustrated, it will be apparent to those skilled in the art that various change may be made therein without de-

I claim:

1. A drive circuit coupled to electrical devices connected in parallel in a circuit network, said electrical devices having distinct total on-time periods when they are simultaneously energized, and then de-energized, said circuit network having a source of power coupled through said parallel connected electrical devices to a load, said drive circuit including in combination;
   a signal source coupled respectively through a time adjustable circuit to a first electrical device and to a second electrical device, said time adjustable circuit being adjusted such that the total on-time of said first electrical device matches the total on-time of said second electrical device to thereby ensure equal current at all times through said electrical devices to said load while maintaining the distinct total on-time periods of said first and said second electrical devices.

2. A drive circuit coupled to the base of transistors connected in parallel in a circuit network, said transistor having distinct turn-on, turn-off, and total-on time periods when their respective bases are simultaneously pulsed, said circuit network having a source of power coupled through said parallel connected transistors to a load, said drive circuit including in combination;
   a transistor base pulse signal source having a predetermined period coupled respectively through a time adjustable circuit to the base of a first transistor and to the base of a second transistor, said time adjustable circuit being adjusted such that the appearance of a pulse from said transistor base signal source causes the total on-time of said first transistor to match(es) the total on-time of said second transistor to match(es) the total on-time of said second transistor to thereby ensure equal current at all times through said transistors to said load while maintaining said distinct turn-on, turn-off, and total on-time of said transistors.

3. The drive circuit of claim 2, wherein said time adjustable circuit includes means to alter the initiation of said first transistor turn-on time period to thereby allow the end of said turn-on time period of said first transistor to coincide with the end of said second transistor turn-on time period.

4. The drive circuit of claim 2, wherein said time adjustable circuit includes means to alter the initiation of said turn-off of said first transistor to thereby allow the turn-off of said first transistor to coincide with the end of said second transistor turn-off time period.

5. The drive circuit of claim 2, wherein said time adjustable circuit includes a first means to alter the initiation of said first transistor turn-on time period to thereby allow the end of said turn-on time period of said first transistor to coincide with the end of said second transistor turn-on time period,
   a second means coupled to said first means to initiate a signal at a point in time after the start of each base pulse signal represented by the difference in the turn-on times of said first and second transistor, said second means signal remaining for a time period equal to said base pulse signal period less said difference in turn-on times of said first and second transistor,
   a third means coupled to said second means and responsive to the end of said second means signal to alter the initiation of said turn-off of said first transistor to thereby allow the turn-off of said first transistor to coincide with the end of said second transistor turn-off time period.

6. The drive circuit of claim 5, wherein said first means includes an AND gate having an output coupled to said second means,
   said AND gate having a pair of inputs, one input is connected to said base pulse signal source and the other input is connected to and through a first one shot multivibrator to said base pulse signal source.

7. The drive circuit of claim 6, wherein said second means includes a second one shot multivibrator having an input coupled to said AND gate output of said first means and an output coupled to said third means.

8. The drive circuit of claim 7, wherein said third means includes an OR gate having an output coupled to said base of said first transistor,
   said OR gate having a pair of inputs, one input is electrically coupled to said second one shot multivibrator output and the other input is connected to and through a third one shot multivibrator to said second one shot multivibrator output.

9. A drive circuit for a three electrical contact semiconductor in a circuit having a power source connected to a first electrical contact of said semiconductor and a load connected to a third electrical contact of said semiconductor, said drive circuit including in combination;
   a logic signal source,
   a positive feedback circuit electrically coupled between said first electrical contact and a second electrical contact of said semiconductor,
   a resonant, impulse current turn-on circuit coupled to said second electrical contact and controlled by said logic signal source, and
   a resonant, impulse current turn-off circuit coupled to said second electrical contact and controlled by said logic signal source, whereby said drive circuit provides optimum turn-on and turn-off time rates for said semiconductor.

10. The drive circuit of claim 9 in which there is a fixed current level turn-on circuit coupled to said second electrical contact and controlled by said logic signal source.

11. The drive circuit of claim 10 in which there is a turn-off steady state reverse bias circuit coupled to said second electrical contact and controlled by said logic signal source.

12. The drive circuit of claim 11, wherein said semiconductor is a transistor and said first, second and third electrical contacts are respectively an emitter, a base and a collector.

13. The drive circuit of claim 12, wherein said positive feedback circuit includes a transformer which couples said emitter and said base to thereby provide better efficiency at part load.

14. The drive circuit of claim 13, wherein said resonant, impulse current turn-on circuit; said resonant, impulse current turn-off circuit; said fixed current level turn-on circuit and said turn-off steady state reverse bias are inductively coupled through said transformer to said base of said transistor.

15. The drive circuit of claim 14, wherein said resonant impulse current turn-on circuit includes a winding inductively coupled to said transformer and a capacitor that cooperates in a resonant manner with the inductance of said transformer to speed up said turn-on.

16. The drive circuit of claim 15, wherein said resonant, impulse current turn-off circuit includes a winding inductively coupled to said transformer, and a capacitor that cooperates in a resonant manner with the inductance of said transformer to provide an impulse current turn-off having a greater value than said impulse current turn-on.

* * * * *